(12) United States Patent
Kano et al.

(10) Patent No.: US 6,353,693 B1
(45) Date of Patent: Mar. 5, 2002

(54) OPTICAL COMMUNICATION DEVICE AND SLIP RING UNIT FOR AN ELECTRONIC COMPONENT-MOUNTING APPARATUS

(75) Inventors: Yoshinori Kano; Takahiro Nagata; Ikuo Takemura, all of Gunma-ken (JP)

(73) Assignee: Sanyo Electric Co., Ltd., Osaka-Fu (JP)

(*) Notice: Subject to any disclaimer, the term of this patent is extended or adjusted under 35 U.S.C. 154(b) by 84 days.

(21) Appl. No.: 09/584,037

(22) Filed: May 30, 2000

(30) Foreign Application Priority Data

May 31, 1999 (JP) .......................................... 11-152802
Jun. 4, 1999 (JP) .......................................... 11-158583

(51) Int. Cl.⁷ ............................................... G02B 6/26
(52) U.S. Cl. ..................... 385/26; 359/159; 359/157; 359/154; 385/42; 385/25
(58) Field of Search ............................. 385/26, 25, 42; 359/159, 154, 157

(56) References Cited

U.S. PATENT DOCUMENTS 4,753,506 A * 6/1988 Einhorn et al. .......... 350/96.15

* cited by examiner

Primary Examiner—Cassandra Spyrou
Assistant Examiner—Christopher S. Maxie
(74) Attorney, Agent, or Firm—Darby & Darby

(57) ABSTRACT

An optical communication device for communication between a stator-side circuit and a rotor-side circuit is provided as one aspect of the invention. A pair of optical couplers are interposed between a stator and a rotor, for permitting bi-directional communication between the circuits. One optical coupler has a rotor-side light-receiving element arranged on the rotor with the axis of rotation extending therethrough, and a stator-side light-emitting element arranged on the stator at a location away from the axis of rotation. The other optical coupler has a stator-side light-receiving element arranged on the stator with the axis of rotation extending therethrough, and a rotor-side light-emitting element arranged on the rotor at a location away from the axis of rotation. A slip ring unit for an electronic component-mounting apparatus is provided as another aspect of the invention. The slip ring unit electrically connects between a rotor-side circuit and a stator-side circuit. A slip ring has a rotary conductive member coaxially fixed on the rotary table and connected to the rotor-side circuit, and a brush member in sliding contact with the rotary conductive member and connected to the stator-side circuit. A rotor is coaxially fixed on the rotary conductive member. An element is arranged on the rotor for being sensed. A sensor is opposed to the rotor for sensing the element arranged on the rotor.

14 Claims, 7 Drawing Sheets

OPTICAL COMMUNICATION DEVICE AND SLIP RING UNIT FOR AN ELECTRONIC COMPONENT-MOUNTING APPARATUS

BACKGROUND OF THE INVENTION

1. Field of the Invention

This invention relates to an optical communication device for bidirectionally sending control signals between a rotor-side circuit on the side of a rotary table and a stator-side circuit outside of the rotary table, including the circuit of a host computer, as well as a slip ring unit for an electronic component-mounting apparatus, for electrically and continuously connecting between a rotor-side circuit on the side of a rotary table and a stator-side circuit outside of the rotary table.

2. Prior Art

Conventionally, an optical communication device of this kind has been proposed e.g. by Japanese Laid-Open Patent Publication (Kokai) No. 8-83998, which is installed in a high-speed mounter. In the high-speed mounter, rotary table-side motor drivers on a rotor side and a host computer-side circuit on a stator side are connected to each other by an optical coupler formed by a pair of light-emitting/receiving elements, via which input/output (optical communication) of control signals is performed between the host computer and the motor drivers.

In the optical coupler, one of the light-emitting/receiving elements is secured on an end face of a shaft of the rotary table, and the other on an end face of a base, the two elements being opposed to each other on the rotation axis of the shaft.

As described above, in the conventional optical communication device, since the pair of light-emitting/receiving elements each serving as both a light-emitting element and a light-receiving element are used, each light-receiving element (light-receiving portion) is not capable of receiving light from an opposed light-emitting element (light-emitting portion) completely separately from light from an adjacent light-emitting element (light-emitting portion). To overcome this problem, the conventional optical device needs provision of a modulation circuit and a demodulation circuit, which results in an increase in manufacturing costs of the device.

In a high-speed mounter disclosed in Japanese Laid-Open Patent Publication (Kokai) No. 6-37488, a plurality of slit disks and a plurality of photo-interrupters opposed to the slit disks are arranged on top of the shaft of a rotary table, to form detection means for sensing the positions of a plurality of mounting heads carried by the rotary table.

On the periphery of the rotary table, there are arranged mounting heads corresponding in number to the number of indexing steps for one turn of the rotary table, and further, around the periphery of the rotary table there are arranged a plurality of work stations including one for picking up an electronic component by vacuum and one for mounting the picked electronic component, in number dependent on the number of the indexing steps for one-turn of the rotary table, where face the mounting heads in temporary stoppage.

The above detection means detects which of the mounting heads that are assigned respective head numbers is positioned at which of the work stations, thereby enabling control of rotation and upward and downward motion of each of the mounting heads.

The mounting heads each carry a motor for rotating and lifting up and down itself, and supply of electrical drive power and input (or input/output) of a control signal are carried out via a slip ring mounted on the shaft of the rotary table. Therefore, in the conventional high-speed mounter, the slip and the above sensing means are arranged on the shaft of the rotary table separately from each other, and this not only requires a large installation space, but also increases the number of components and the steps of assembly process.

SUMMARY OF THE INVENTION

It is a first object of the invention to provide an optical communication device for permitting appropriate bidirectional optical communication between a stator-side circuit and a rotor-side circuit by ensuring separation of lights transmitted in opposite directions.

It is a second object of the invention to provide a slip ring unit which can attain the reduction of the number of components and space for installation of the components by unitizing a slip ring and rotation-sensing means of a rotary table.

To attain the first object, according to a first aspect of the invention, there is provided an optical communication device for communicating between a circuit arranged on a side of a stator and a circuit arranged on a side of a rotor having an axis of rotation.

The optical communication device according to the first aspect of the invention is characterized by comprising:

a pair of optical couplers arranged between the stator and the rotor, for permitting signals to be bidirectionally transmitted between the circuit arranged on the side of the stator and the circuit arranged on the side of the rotor, one of the pair of optical couplers having a rotor-side light-receiving element arranged on the rotor such that the axis of rotation extends therethrough, and a stator-side light-emitting element arranged on the stator at a location away from the axis of rotation and having an optical axis directed toward the rotor-side light-receiving element, and another of the pair of optical couplers having a stator-side light-receiving element arranged on the stator such that the axis of rotation extends therethrough, and a rotor-side light-emitting element arranged on the rotor at a location away from the axis of rotation and having an optical axis directed toward the stator- side light-receiving element.

According to this optical communication device, in one of the optical couplers, an optical signal emitted from the stator-side light-emitting element is received by the rotor-side light-receiving element, while in the other of the optical couplers, an optical signal emitted from the rotor-side light-emitting element is received by the stator-side light-receiving element.

The optical axis of the stator-side light-emitting element is directed toward the rotor-side light-receiving element on the axis of the rotor, and hence, even when the rotor-side light-receiving element rotates with rotation of the rotor, the optical signal from the stator-side light-emitting element does not miss the rotor-side light-emitting element and is positively received thereby. Similarly, the optical axis of the rotor-side light-emitting element is directed toward the stator-side light-receiving element on the axis of the rotor, and hence, even when the rotor-side light-emitting element rotates with rotation of the rotor, the optical signal from the rotor-side light-emitting element does not miss the stator-side light-receiving element and is positively received thereby.

Further, since the rotor-side light-emitting element is arranged at a location away from the axis of rotor, the rotor-side light-emitting element and the rotor-side light receiving element on the axis of the rotor do not interfere with each other by their locations. Similarly, since the stator-side light-emitting element is arranged at a location away from the axis of rotor, the stator-side light-emitting element and the stator-side light receiving element on the axis of the rotor do not interfere with each other by their locations.

Preferably, the stator-side light-emitting element and the stator-side light-receiving element are mounted on the stator in a state molded into one piece by using an optically transparent resin, and the rotor-side light-emitting element and the rotor-side light-receiving element are mounted on the rotor in a state molded into one piece by using an optically transparent resin.

Preferably, the stator-side light-emitting element and the rotor-side light-emitting element are each formed by a device selected from the group consisting of a light-emitting diode and a laser diode.

Preferably, the stator-side light-receiving element and the rotor-side light-receiving element are each formed by a device selected from the group consisting of a photo-transistor and a photo-diode.

To attain the first object, according to a second aspect of the invention, there is provided an optical communication device for communicating between a circuit arranged on a side of a stator and a circuit arranged on a side of a rotor having an axis of rotation.

The optical communication device according to the second aspect of the invention is characterized by comprising:

a pair of optical couplers arranged between the stator and the rotor, for permitting signals to be bidirectionally transmitted between the circuit arranged on the side of the stator and the circuit arranged on the side of the rotor, one of the pair of optical couplers having a rotor-side light-receiving element arranged on the rotor such that the axis of rotation extends therethrough, a stator-side half-mirror arranged on the stator such that the axis of rotation extends therethrough, and a stator-side light-emitting element arranged on the stator and having an optical axis extending toward the rotor-side light-receiving element via the stator-side half-mirror, and another of the pair of optical couplers having a stator-side light-receiving element arranged on the stator such that the axis of rotation extends therethrough, a rotor-side half-mirror arranged on the rotor such that the axis of rotation extends therethrough, and a rotor-side light-emitting element arranged on the rotor and having an optical axis extending toward the stator-side light-receiving element via the rotor-side half-mirror.

According to this optical communication device, in one optical coupler, the optical signal emitted from the stator-side light-emitting element is reflected from the stator-side half-mirror and then received by the rotor-side light-receiving element, while in the other optical coupler, the optical signal emitted from the rotor-side light-emitting element is reflected from the rotor-side half-mirror and received by the stator-side light-receiving element.

The optical axis of the stator-side light-emitting element is bent at the stator-side half-mirror and directed to the rotor-side light receiving element on the axis of the rotor, and hence even when the rotor-side light-receiving element rotates with rotation of the rotor, the optical signal from the stator-side light-emitting element does not miss the rotor-side light-emitting element and is positively received thereby. Similarly, the optical axis of the rotor-side light-emitting element is bent at the rotor-side half-mirror and directed to the stator-side light receiving element on the axis of the rotor, and hence, even when the rotor-side light-emitting element rotates with rotation of the rotor, the optical signal from the rotor-side light-emitting element does not miss the stator-side light-receiving element and is positively received thereby.

Further, since the rotor-side half-mirror enables the rotor-side light-emitting element to be arranged at a location away from the axis of rotor, the rotor-side light-emitting element and the rotor-side light-receiving element on the axis of the rotor do not interfere with each other by their locations. Similarly, since the stator-side half-mirror enables the stator-side light-emitting element to be arranged at a location away from the axis of rotor, the stator-side light-emitting element and the stator-side light receiving element on the axis of the rotor do not interfere with each other by their locations.

Preferably, the stator-side light-emitting element and the stator-side light-receiving element are mounted on the stator in a state molded into one piece by a first optically transparent resin, the stator-side half-mirror being formed on a phase boundary formed in the first optically transparent resin in a manner dividing the first optically transparent resin into two parts, and the rotor-side light-emitting element and the rotor-side light-receiving element are mounted on the rotor in a state molded in to one piece by a second optically transparent resin, the rotor-side half-mirror being formed on a phase boundary formed in the second optically transparent resin in a manner dividing the second optically transparent resin into two parts.

Preferably, the rotor-side half-mirror and the stator-side half-mirror are each formed on the phase boundary by depositing a metal coating thereon.

To attain the first object, according to a third aspect of the invention, there is provided an optical communication device for communicating between a circuit arranged on a side of a stator and a circuit arranged on a side of a rotor having an axis of rotation.

The optical communication device according to the third aspect of the invention is characterized by comprising:

a pair of optical couplers arranged between the stator and the rotor, for permitting signals to be bidirectionally transmitted between the circuit arranged on the side of the stator and the circuit arranged on the side of the rotor, one of the pair of optical couplers having a light-emitting element arranged on one of the stator and the rotor such that the axis of rotation extends therethrough, and a light-receiving element arranged on another of the stator and the rotor such that the axis of rotation extends therethrough, and another of the pair of optical couplers having an annular light-emitting element arranged on the another of the stator and the rotor in a manner concentric with respect to the axis of rotation, and an annular light-receiving element arranged on the one of the stator and the rotor in a manner concentric with respect to the axis of rotation.

According to this optical communication device, in one optical coupler, the optical signal emitted from the light-emitting element is received by the light-receiving element, while in the other optical coupler, the optical signal emitted from the annular light-emitting element is received by the annular light-receiving element.

The light-emitting element and the light-receiving element are arranged on the axis of the rotor, and hence even when any of these elements rotates with rotation of the rotor, the optical signal from the light-emitting element does not miss the light-emitting element and is positively received thereby. Similarly, the annular light-emitting element and the annular light-receiving element are concentrically arranged with respect to the axis of the rotor, and hence, even when any of these annular elements rotates with rotation of the rotor, the optical signal from the annular light-emitting element does not miss the annular light-receiving element and positively received thereby.

Further, since the light-emitting element and the annular light-receiving element can be are arranged such that they do not interfere with each other, and the light-receiving element and the annular light-emitting element can be arranged such that they do not interfere with each other.

Preferably, the annular light-emitting element comprises a first annular light-diffusing member, and a light-emitting diode arranged on a reverse side of the first annular light-diffusing member, and the annular light-receiving element comprises a second annular light-diffusing member, and a phototransistor arranged on a reverse side of the second annular light-diffusing member.

According to this preferred embodiment, even a light-emitting diode having a small light-emitting portion, and a phototransistor having a small light-receiving portion are used, an optical signal from the light-emitting diode can be positively received by the phototransistor. Further, it is preferred that a plurality of light-emitting diodes and a plurality of phototransistors are provided at equal intervals along the circumferences of the light-diffusing members associated therewith.

Preferably, the optical communication device includes an annular light shield arranged between the light-emitting element and the annular light-receiving element, and an annular light shield arranged between the light-receiving element and the annular light-emitting element.

According to this preferred embodiment, the light shields make it possible to prevent the optical signal emitted from the light-emitting element from being received by the annular light-receiving element adjacent thereto, and prevent the optical signal emitted from the annular light-emitting element from being received by the light-receiving element adjacent thereto.

To attain the second object, according to a fourth aspect of the invention, there is provided a slip ring unit for an electronic component-mounting apparatus including a rotary table carrying a plurality of mounting heads, a rotor-side circuit arranged in the rotary table, and a stator-side circuit arranged outside of the rotary table, the slip ring unit electrically connecting between the rotor-side circuit and the stator-side circuit.

The slip ring unit is characterized by comprising:
  a slip ring, the slip ring having a rotary conductive member coaxially fixed on the rotary table and connected to the rotor-side circuit, and a brush member in sliding contact with the rotary conductive member and connected to the stator-side circuit;
  a rotor coaxially fixed on the rotary conductive member;
  an element arranged on the rotor for being sensed; and
  a sensor opposed to the rotor for sensing the element arranged on the rotor.

According to this slip ring unit, in addition to the slip ring, the rotor having the member for being sensed, and the sensor are provided, and hence it is possible to detect the rotational angle of the rotary table or the positions of the mounting heads by way of the rotor. Further, since the rotation-sensing means and the slip ring are unitized, it is possible to reduce the number of components and space for installation of them. When a plurality of kinds of objects are detected in relation to the rotary table, it is preferred that there are provided a plurality of sets of rotors and sensors.

Preferably, the slip ring unit includes a housing covering the rotor and the sensor.

According to this preferred embodiment, the rotor and the sensor can be covered by the housing, whereby an erroneous detection caused by an environment, such as spilt lubricating oil and drifting dust, can be prevented.

Preferably, the slip ring unit further includes an optical coupler arranged coaxially with respect to the rotor, for permitting optical communication between the rotor-side circuit and the stator-side circuit, and supply of electrical drive power from the stator-side circuit to the rotor-side circuit is carried out via the brush member and the rotary conductive member, and transmission of signals from the stator-side circuit to the rotor-side circuit is carried out via the optical coupler.

According to this preferred embodiment, the slip ring can be made compact, and compared with the case of using a brush member, it is possible to enhance the reliability of input and output of control signals.

Preferably, the rotary conductive member includes a plurality of electrodes, and the brush member comprises a plurality of brush portions in sliding contact with the electrodes, respectively.

The above and other objects, features, and advantages of the invention will be made more apparent from the following detailed description taken in conjunction with the accompanying drawings.

DETAILED DESCRIPTION

The invention will now be described in detail with reference to drawings showing embodiments thereof.

Figure 1:
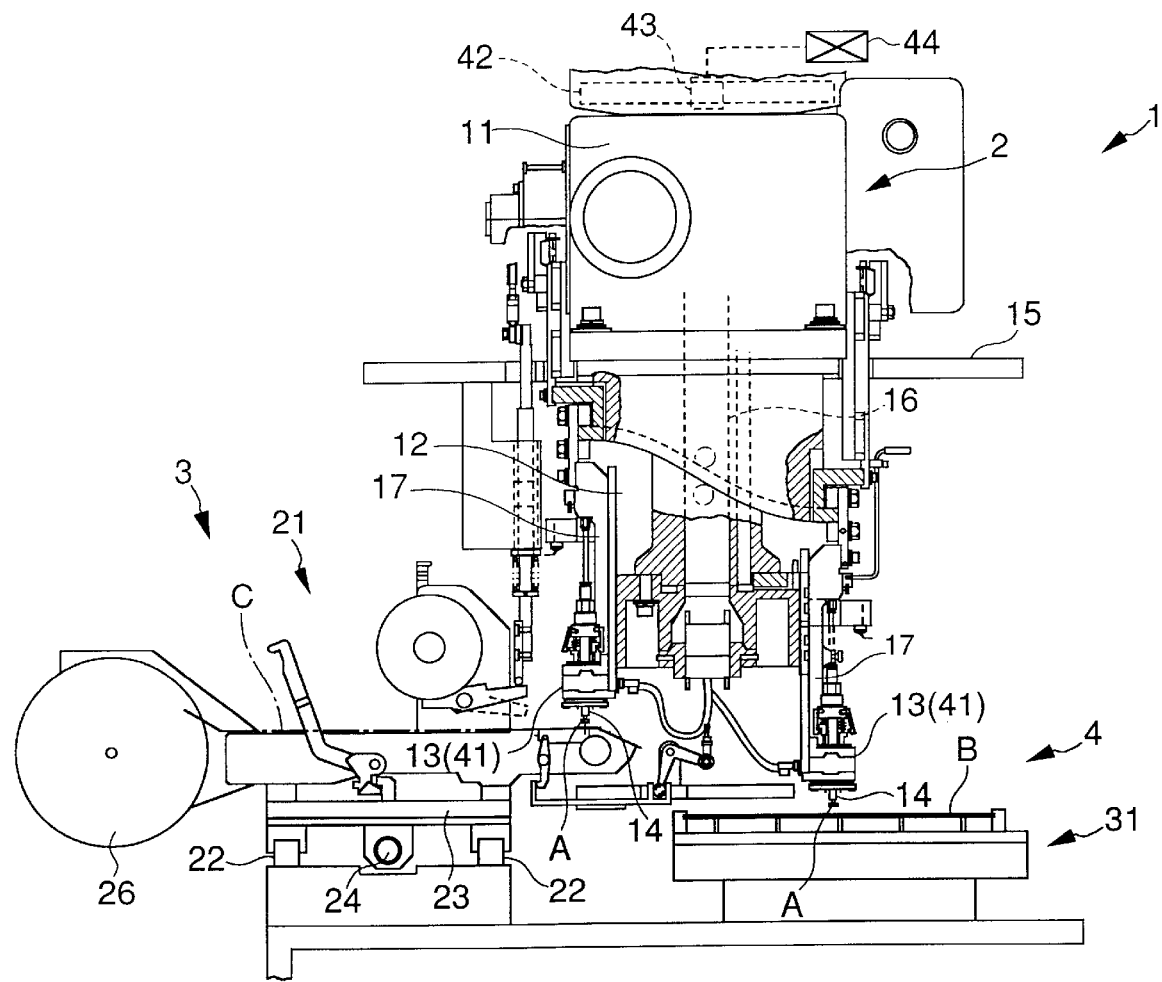
FIG. 1 is a side elevation of an electronic component-mounting apparatus in which is installed an optical communication device according to a first embodiment of the invention.
Figure 2:
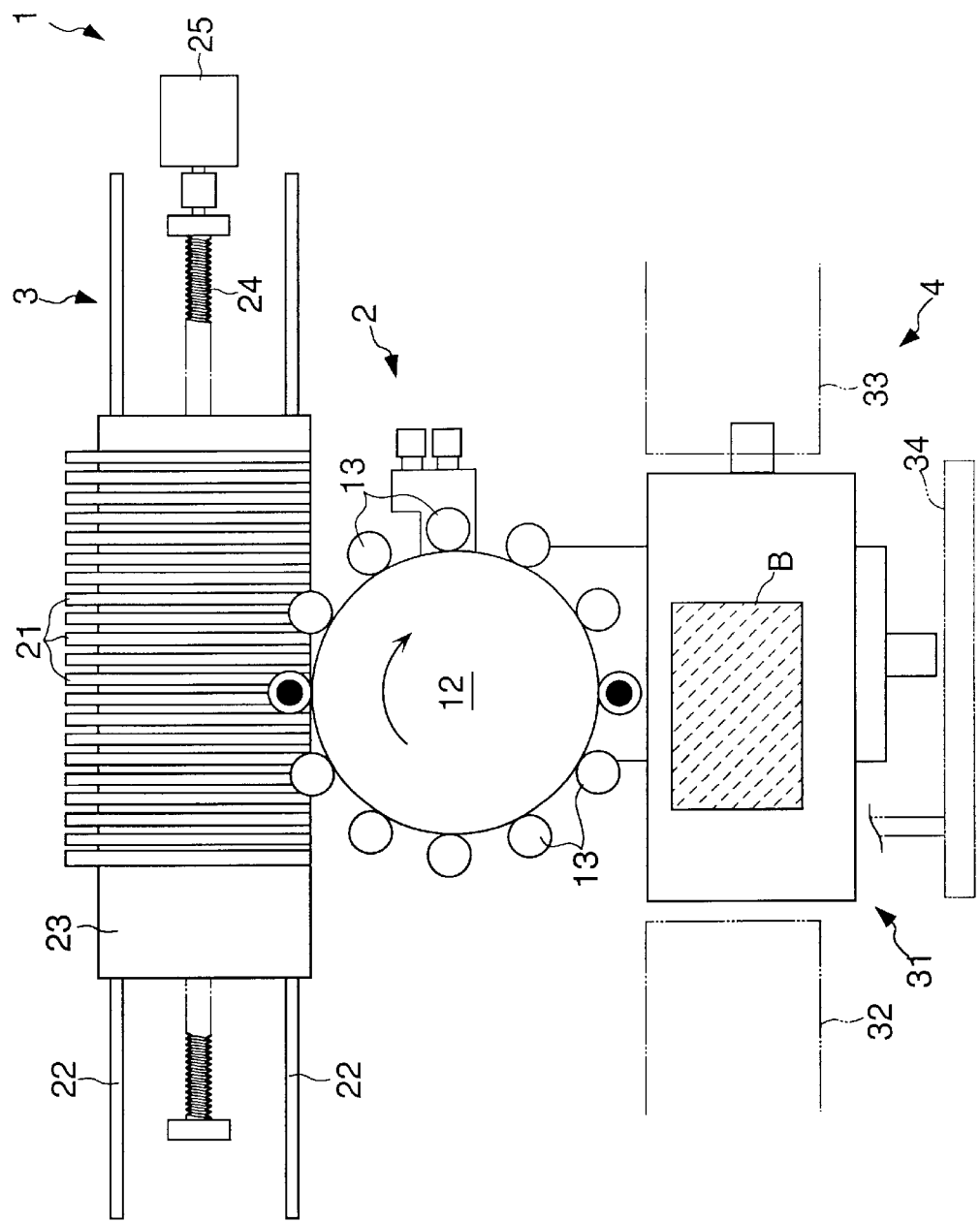
FIG. 2 is a plan view of the FIG. 1 electronic component-mounting apparatus.

Referring first to FIGS. 1 and 2, there is shown an electronic component-mounting apparatus (high-speedmounter) 1 incorporating an optical communication device according to a first embodiment of invention. The electronic component-mounting apparatus is comprised of a main unit 2, a feeding section 3 for feeding electronic components A, and a mounting section 4 for mounting the electronic components A on a circuit board B, with the feeding section 3 and the mounting section 4 being arranged on opposite sides of the main unit 2 in parallel with each other.

The main unit 2 is comprised of an index unit 11 which forms a main part of a driving system of the apparatus, a rotary table 12 coupled thereto, and a plurality of (twelve, in the present embodiment) mounting heads 13 arranged on the outer periphery of the rotary table 12. The rotary table 12 is intermittently rotated by the index unit 11 in angular increments corresponding to the number of the mounting heads 13. With intermittent rotation of the rotary table 12, a selected one of vacuum nozzles 14 carried by each mounting head 13 is properly brought to the feeding section 3 and the mounting section 4, whereby each selected vacuum nozzle 14 picks up by vacuum an electronic component A supplied at the feeding section 3, carries the same to the mounting section 4 through intermittent rotation of the rotary table 12, and mounts the same on a circuit board B supplied at the mounting section 4.

The feeding section 3 has tape cassettes 21 corresponding in number to the number of kinds of electronic components A to be mounted on the circuit board B. The tape cassettes 21 are removably mounted on a feed table 23 in parallel with each other perpendicularly to the directions of forward/backward movements of the feed table 23. The feed table 23 is slidably guided by a pair of guide rails 22, 22. A ball screw 24 extends through the feed table 23 in a direction of its sliding on the guide rails 22, whereby the feed table 23 is moved forward and backward by respective normal and reverse rotations of a feed motor 25 connected to one end of the ball screw 24, to selectively bring a selected one of the tape cassettes 21 to a pickup station for the mounting heads 13. Each tape cassette 21 contains a roll of a carrier tape C which carries electronic components A thereon at intervals of a predetermined pitch and is wound around a tape reel 26, and the electronic components A are sequentially picked up by a corresponding one of the vacuum nozzles 14 by vacuum as the carrier tape C is unwound from the tape reel 26.

The mounting section 4 is comprised of an X-Y table 31 for moving the circuit board B placed thereon in the directions of an X axis and a Y axis, a feed conveyor 32 and a delivery conveyor 33 arranged to face respective opposite longitudinal ends of the X-Y table 31, and a circuit board transfer device 34 for transferring a circuit board B on the feed conveyor 32 onto the X-Y table 31 and at the same time transferring a preceding circuit board B already placed on the X-Y table onto the delivery conveyor 33. That is, the circuit board B brought to a downstream end of the feed conveyor 32 is transferred by the circuit board transfer device 34 onto the X-Y table 31, and at the same time, the preceding circuit board B having the electronic parts A mounted thereon is transferred by the circuit board transfer device 34 onto the delivery conveyor 33. The circuit board B placed on the X-Y table 31 is moved to its predetermined positions by the X-Y table 31 such that specific portions thereof are sequentially brought to a mounting station for the mounting heads 13, at which each electronic component A held at a selected vacuum nozzle 14 of each mounting head 13 is mounted on a predetermined portion of the circuit board B.

The index unit 11 of the main unit 2, which forms the main part of the whole driving system of the apparatus, is supported by a support table 15. The index unit 11 intermittently rotates the rotary table 12, and at the same time causes various devices mounted on the main unit 2 to operate in a manner synchronous with a repetition period of intermittent rotation of the rotary table 12.

The rotary table 12 is rigidly mounted on a vertical shaft 16 extending perpendicularly downward from the index unit 11 and is driven for clockwise intermittent rotation as viewed in FIG. 2. The twelve mounting heads 13 arranged at circumferential intervals along the periphery of the rotary table 12 are fixed to respective brackets 17 vertically movably mounted on the periphery of the rotary table 12. In the present embodiment, the rotary table 12 performs twelve intermittent rotations or index motions to make one complete rotational turn in a manner corresponding to the number of mounting heads 13. The mounting heads 13, which intermittently move about the rotation axis of the rotary table 12, are sequentially brought to twelve stations including the pickup station in the feeding section, at which electronic components A are picked up by vacuum by respective selected vacuum nozzles 14, and the mounting station in the mounting section, at which the picked electronic components A are sequentially mounted on a circuit board B as well as a station at which an image of the picked electronic component A is taken and a position thereof is corrected if required, and another station at which nozzles are changed (or switched).

Each mounting head 13 has a plurality of (approximately five, in the present embodiment) vacuum nozzles 14 arranged at circumferential equal intervals on the periphery thereof in a manner capable of projecting and retracting vertically, and a stepping-motor incorporated therein for causing the vacuum nozzles 14 to move about the vertical axis of the mounting head 13. Further, the main unit 2 has an elevating mechanism incorporated therein for engaging with a mounting head 13 brought to the pickup station or the mounting station, to thereby lift and lower the same. As described in detail hereinafter, various motors 41 including the stepping motors are each driven by a corresponding motor driver 42 arranged on the top of the index unit 11, and supply of electrical drive power to the drive sources from a power supply circuit, not shown, and input/output of control signals to and from a host computer 43, referred to hereinafter, are carried out via a slip ring unit 44 also arranged on the top of the index unit 11. That is, the power supply circuit and the host computer 43 form a circuit on a stator side, while the motor drivers 42 form a circuit on a rotor side.

Figure 3:
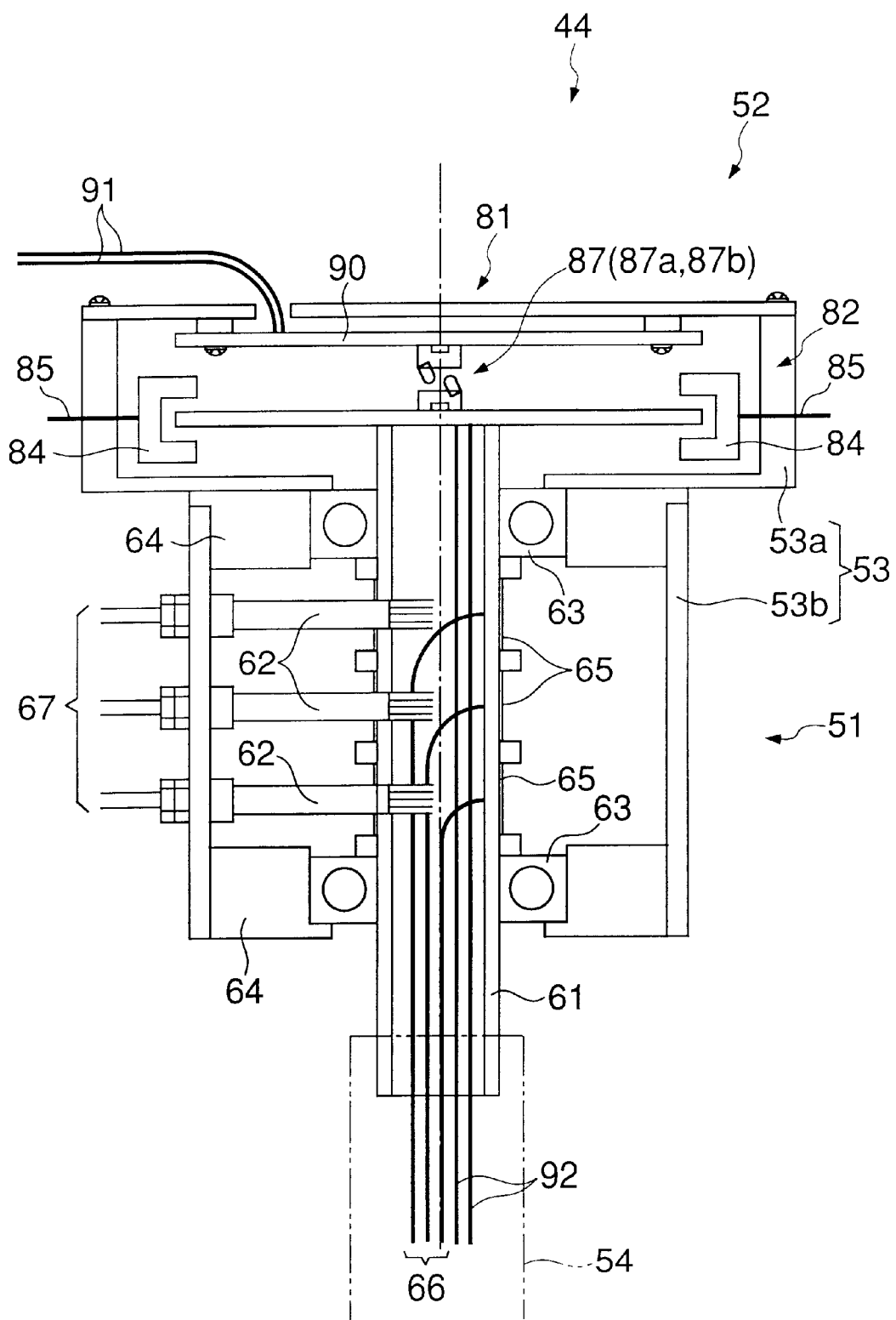
FIG. 3 is a longitudinal sectional view of a slip ring unit according to the first embodiment.

Referring to FIG. 3, the slip ring unit 44 is comprised of a slip ring block 51 positioned below, a sensing/communication block 52 positioned above, and a casing 53 housing the blocks 51, 52. The casing 53 is formed by an upper casing 53a having a lid and a lower casing 53b having a hollow cylindrical shape. The upper casing 53a accommodates the sensing/communication block 52, while the lower casing 53b accommodates the slip ring block 51.

The slip ring block 51 is comprised of a rotary conductive member 61 having a lower end thereof arranged coaxially with the rotary table 12 and linked to a shaft 54 of the same and a plurality of brush elements 62 for sliding contact with the rotary conductive member 61. The rotary conductive member 61 has an upper end portion thereof extending into the sensing/communication block 52 and two upper and lower portions thereof rotatably supported by upper and lower support members 64, 64 via bearings 63, 63, respectively. On an outer peripheral surface of the rotary conductive member 61, there are formed a plurality of electrodes 65 for sliding contact with the respective brush elements 62, and each of the electrodes 65 has a downstream power supply cable 66 connected thereto which extends through the rotary conductive member 61, and is connected to a corresponding one of the motors 41.

The lower casing 53b is mounted to the upper and lower support members 64, 64, for housing the rotary conductive member 61 and the plurality of brush elements 62. Each of the brush elements 62 has a root thereof secured to an inner peripheral surface of the lower casing 53b and an end thereof held in sliding contact with the outer peripheral surface (corresponding electrode 65) of the rotary conductive member 61. Further, the root of each of the brush elements 62 is connected to an upstream power supply cable 67 which extends through a wall of the lower casing 53b. Electrical drive power is supplied from the power supply circuit, not shown, through the upstream power supply cables 67, the brush elements 62, the rotary conductive member 61, and the downstream cables 66, to the motors 41 for driving them.

Next, before describing the sensing/communication block 52, a control system associated therewith will be described.

Figure 4:
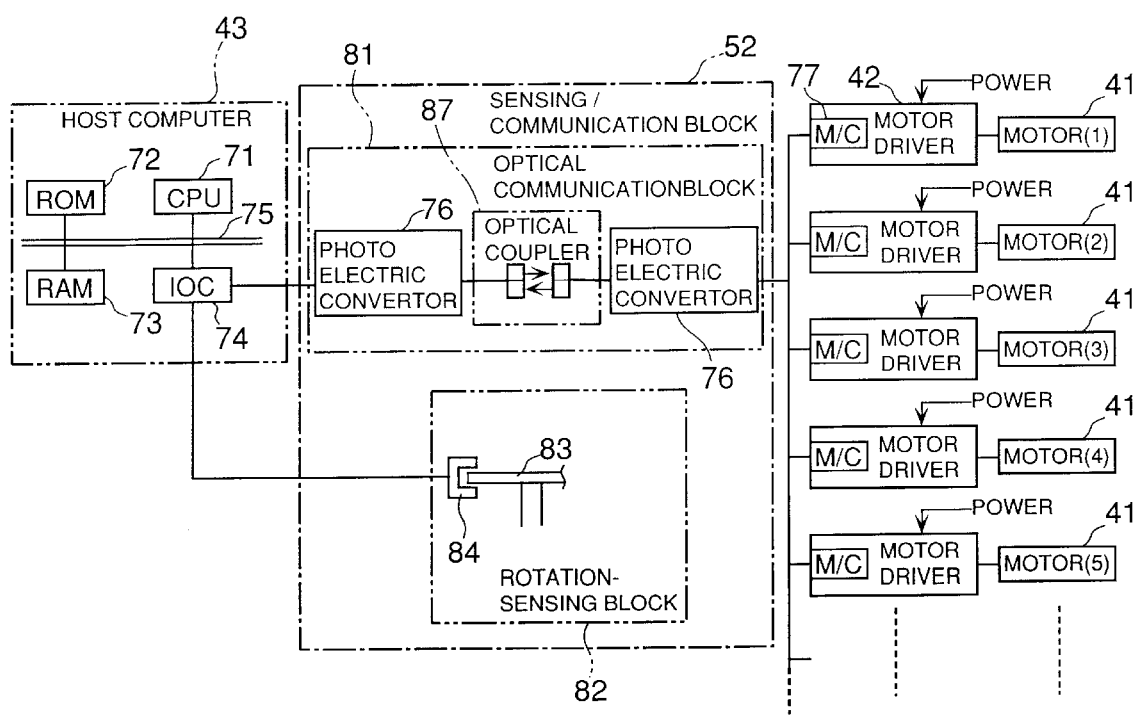
FIG. 4 is a block diagram showing a control system of part of the FIG. 1 electronic component-mounting apparatus.

Referring to FIG. 4, there is shown the control system associated with the slip ring unit 44. As shown in the figure, the control system is comprised of the host computer 43 that controls the overall operation of the electronic component-mounting apparatus 1, the sensing/communication block 52 of the slip ring unit 44, and the various motors (motor (1), motor (2), . . . ) 41 including the stepping motors, and the motor drivers 42 for driving the respective motors 41. The host computer 43 includes a CPU 71, a ROM 72 storing various control programs, a RAM 73 used as a work area for processing various data, and an input/output control circuit (IOC) 74, all of which are connected to each other by an internal bus 75. The IOC 74 has a circuit incorporated therein for complementing the functions of the CPU 71 as well as handling interface signals for interfacing between the CPU 71 and each of components of the electronic component-mounting apparatus 1. Therefore, the IOC 74 is connected particularly to the sensing/communication block 52 so as to control input/output between the CPU 71 and the sensing/communication block 52 in cooperation with the CPU 71. Thus, the CPU 71 processes various data in the RAM 73 according to the control programs stored in the ROM 72 and controls the operations of the components of the electronic component-mounting apparatus 1 via the IOC 74.

As shown in FIGS. 3 and 4, the sensing/communication block 52 includes an optical communication block (optical communication device) 81 for input/output of control signals between the host computer 42 and the sensing/communication block 52, and a rotation-sensing block 82 for sensing the rotational position of the rotary table 12 and so forth. The rotation-sensing block 82 is comprised of a slit disk 83 fixed on an upper end face of the rotary conductive member 61 and a plurality of photo interrupters 84 facing a periphery of the slit disk 83. The photo interrupters 84 are each connected to the host computer 43 via a corresponding sensor line 85. In the present embodiment, for instance, by optically sensing a plurality of slits formed at circumferential equal intervals on the periphery of the slit disk 83, by the use of the photo interrupters (or a single photo interrupter) 84, it is possible to detect the rotational angle of the rotary table 12 (rotary encoder). Alternatively, if a plurality of slits or a plurality of photo interrupters 84 are arranged at unequal intervals, it is possible to detect, for instance, which of the mounting heads 13 has been brought to the pickup station in the feeding section.

The optical communication block 81 which serves as the optical communication device includes a bidirectional coupler 87 comprised of a pair of optical couplers 87a, 87b and an photoelectric converter 76. The pair of optical couplers 87a, 87b are interposed each in a mutually inverted or opposed position between the slit disk 83 and a circuit board (photoelectric converter 76) 90 suspended from an upper inner wall of the upper casing 53a in parallel with the same. The slit disk 83 also serves as a circuit board. Two upstream control lines 91 having respective one ends thereof connected to the host computer 43 have the respective other ends thereof connected to the bidirectional coupler 87 via the circuit board 90, while two downstream control lines 92 having respective one ends thereof connected to the motor drivers 42 have the respective other ends thereof connected to the bidirectional coupler 87 via the slit disk 83.

Thus, the control signals from the host computer 43 are input to the motor drivers 42 via the optical coupler 87a by optical communication. Each of the motor drivers 42 has a one-chip microcomputer (M/C) 77 incorporated therein, and a signal from the M/C 77, such as a control process-starting signal, is output to the host computer 42 via the other optical coupler 87b. Thus, the control system carries out control operation through optical communication by using optical coupler 87, which ensures the reliable input/output of the control signals. Further, since the optical coupler 87 is accommodated within the upper casing 53a, it is possible to prevent mechanically-caused communication failure due to attachment of dust and dirt to the light-emitting/ receiving elements 88, 89.

Figure 5:
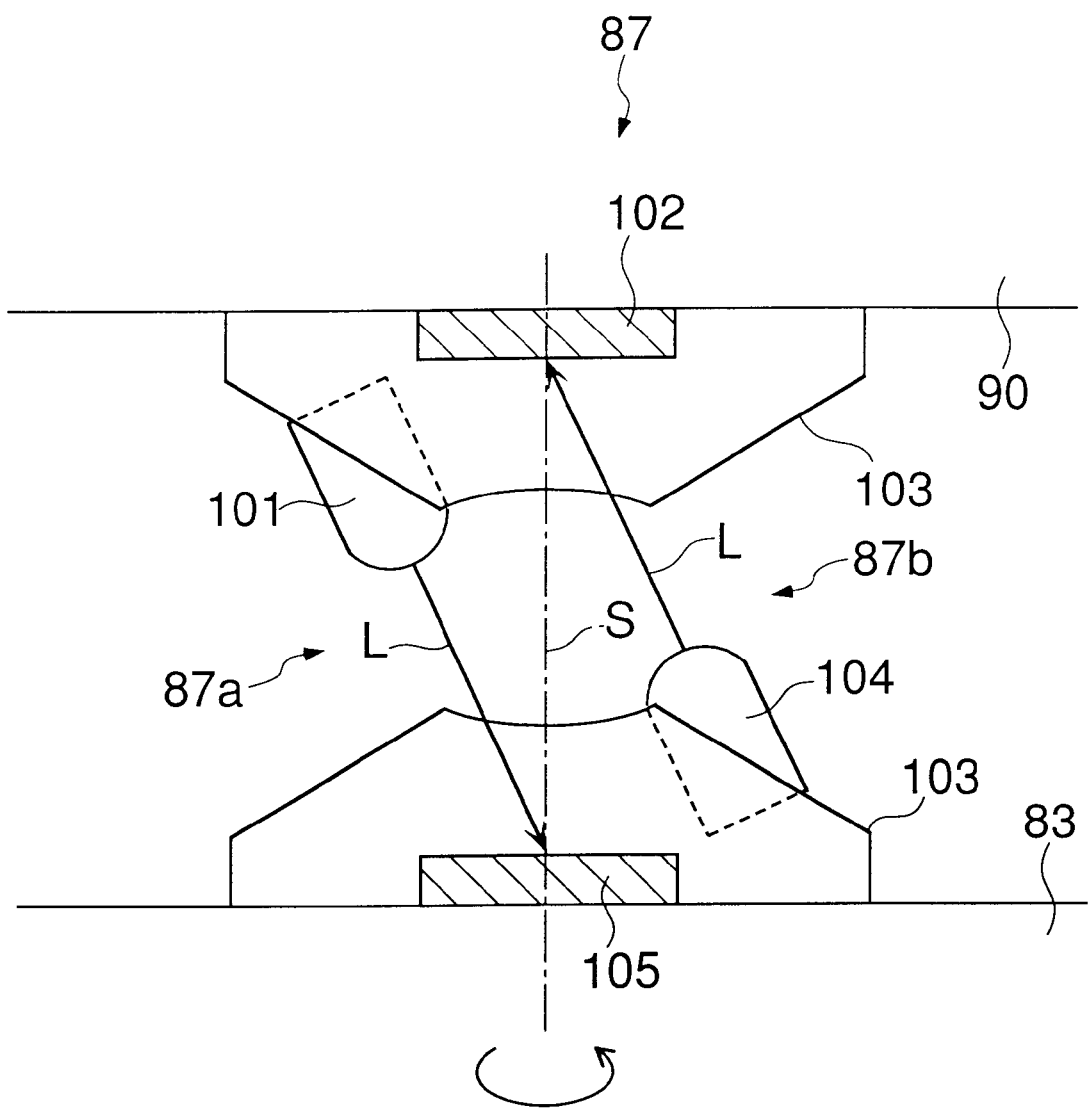
FIG. 5 is a view schematically showing the construction of the optical communication block (optical communication device) according to the first embodiment.

Now, the construction of the bidirectional coupler 87 is described with reference to FIG. 5. As shown in the figure, a stator-side light-emitting element 101 and a stator-side light-receiving element 102 are attached to an underside surface of the upper circuit board (stator-side member) 90 in a state molded with an optically transparent resin 103. Similarly, a rotor-side light-emitting element 104 and a rotor-side light-receiving element 105 are attached to a topside surface of the slit disk (rotary member) 83 in a state molded with an optically transparent resin 103. The output optical coupler 87a of the bidirectional coupler 87, which is arranged on an output side of the host computer 43, is formed by the stator-side light-emitting element 101 and the rotor-side light-receiving element 105, while the input optical coupler 87b arranged on an input side of the host computer 43 is formed by the rotor-side light-emitting element 104 and the stator-side light-receiving element 102.

In the present embodiment, the stator-side and rotor-side light-receiving elements 102, 105 are arranged on a rotation axis S of the slit disk 83 in a manner opposed to each other. The stator-side light-emitting element 101 is arranged in a tilted manner at a location away from the axis S and the stator-side light-receiving element 102, such that an optical axis L thereof is directed toward a center of the rotor-side light-receiving element 105. Accordingly, an optical signal emitted from the stator-side light-emitting element 101 travels toward the rotor-side light-receiving element 105 along a path tilted through a predetermined angle with respect to the axis S, to be received by the same. Similarly, the rotor-side light-emitting element 104 is arranged in a tilted manner at a location away from the axis S and the rotor-side light-receiving element 105, such that an optical axis L thereof is directed toward a center of the stator-side light-receiving element 102. Therefore, similarly to the optical signal emitted from the stator-side light-emitting element 101, an optical signal emitted from the rotor-side light-emitting element 104 travels toward the stator-side light-receiving element 102 along a path tilted through a predetermined angle with respect to the axis S, to be received by the same.

According to this construction, since the optical axis L of the stator-side light-emitting element 101 is directed toward the center of the rotor-side light-receiving element 105, even when the rotor-side light-receiving element 105 rotates with rotation of the slit disk 83, the optical signal from the stator-side light-emitting element 101 does not miss the rotor-side light-receiving element 105. Similarly, since the optical axis L of the rotor-side light-emitting element 104 is directed toward the center of the stator-side light-receiving element 102, even when the rotor-side light-emitting element 104 rotates with rotation of the slit disk 83, the optical signal from the rotor-side light-emitting element 104 does not miss the stator-side light-receiving element 102. Therefore, regardless of whether or not the slit disk 83 is rotating, it is possible to carry out bidirectional optical communications.

Further, since the optical axis L is tilted with respect to the rotation axis S, interference does not occur between the stator-side light-emitting element 101 and the stator-side light-receiving element 102 or between the rotor-side light-emitting element 104 and the rotor-side light-receiving element 105. Moreover, since the bidirectional coupler 87 is accommodated in the upper casing 53a, it is possible to prevent mechanically-caused communication failure e.g. due to attachment of dust or dirt on the respective elements 101, 102, 104, 105. It is preferable that the stator-side and rotor-side light-emitting elements 101, 104 are each formed by a light-emitting diode (LED) or a laser diode, and the stator-side and rotor-side light-receiving elements 102, 105 by a phototransistor or a photodiode.

Figure 6:
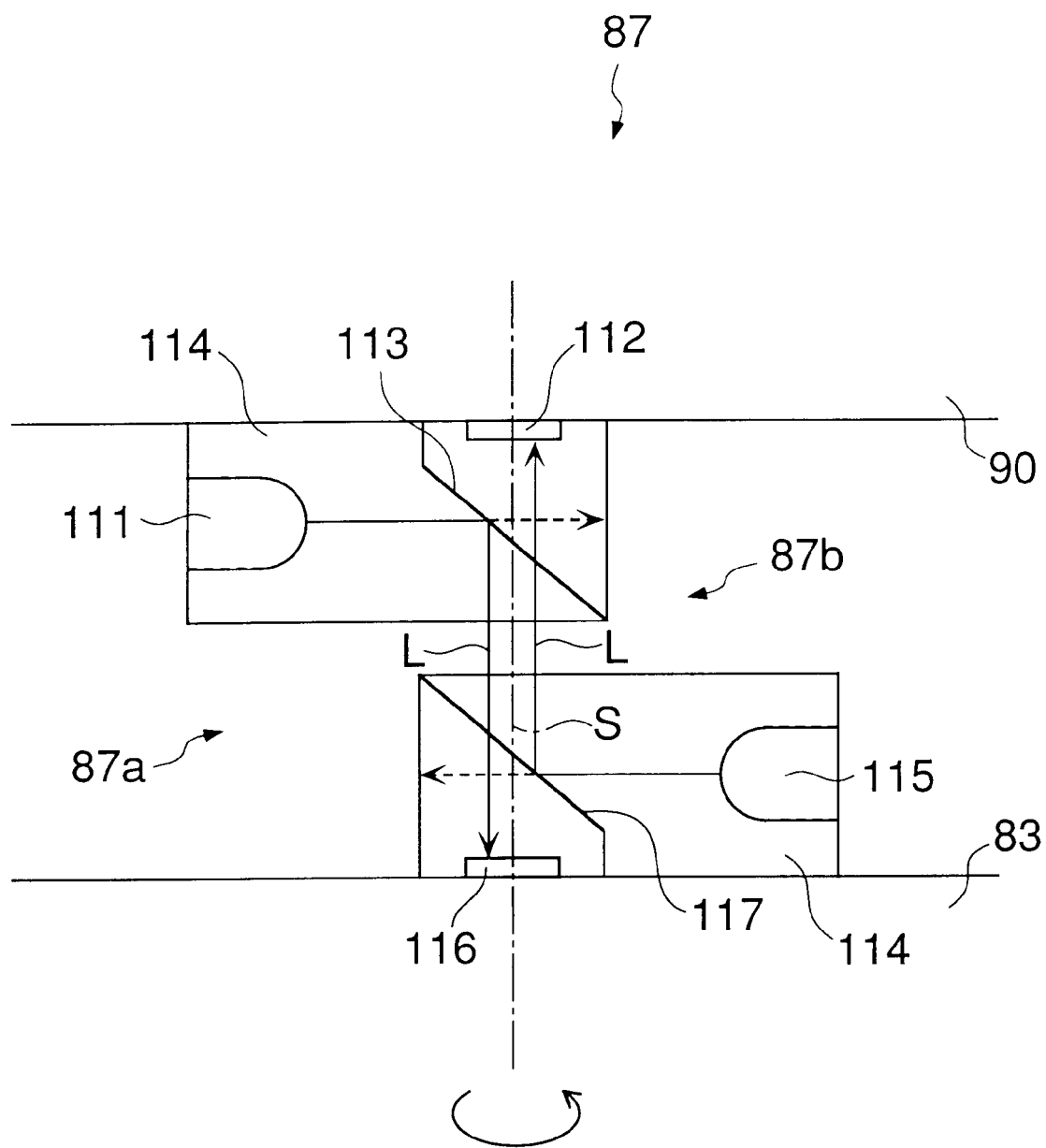
FIG. 6 is a view schematically showing the construction of an optical communication block (optical communication device) according to a second embodiment of the invention.

Referring next to FIG. 6, there is shown the construction of a bidirectional coupler 87 according to a second embodiment of the invention. As shown in the figure, a stator-side light-emitting element 111 and a stator-side light-receiving element 112 are attached to the underside surface of the upper circuit board (stator-side member) 90 in a state molded with an optically transparent resin 114. Further, the resin 114 is formed by joining a light-emitting element-side portion and a light-receiving element-side portion to each other, the two portions having respective faces thereof opposed to each other (phase boundary) and each sloped at a predetermined angle with respect to the axis S, and at the sloped junction between the two faces, there is arranged a stator-side half-mirror 113 formed by depositing a metal coating thereon. Similarly, a rotor-side light-emitting element 115 and a rotor-side light-receiving element 116 are attached to the top side surface of the split disk (rotary member) 83 in a state molded with an optically transparent resin 114 also formed by joining a light-emitting element-side portion and a light-receiving element-side portion to each other, and similarly to the resin 114 on the stator side, the resin 114 on the rotor side has a rotor-side half-mirror 117 arranged therein at a sloped junction thereof. In this embodiment, an output optical coupler 87a is formed by the stator-side light-emitting element 111, the rotor-side light-receiving element 116, and the stator-side half-mirror 113, while an input optical coupler 87b is formed by the rotor-side light-emitting element 115, the stator-side light-receiving element 112, and the rotor-side half-mirror 117. Although in FIG. 6, the half-mirrors 113, 117 are embedded in the resin, this is not limitative, but they may be exposed.

The stator-side and rotor-side light-receiving elements 112, 116 are arranged on the rotation axis S of the slit disk 83 in a manner opposed to each other. The stator-side light-emitting element 111 is arranged in an horizontal orientation at a location away from the stator-side light-receiving element 112 such that an optical axis L thereof is bent or reflected on the stator-side half-mirror 113 and then directed toward the rotor-side light-receiving element 116.

Accordingly, an optical signal emitted from the stator-side light-emitting element 111 is bent or reflected on the stator-side half-mirror 113 and then travels toward the rotor-side light-receiving element 116 to be received by the same. Similarly, the rotor-side light-emitting element 115 is arranged in an horizontal orientation at a location away from the rotor-side light-receiving element 116 such that an optical axis L thereof is bent or reflected on the rotor-side half-mirror 117 and then directed toward the stator-side light-receiving element 112. Therefore, similarly to the optical signal emitted from the stator-side light-emitting element 111, an optical signal emitted from the rotor-side light-emitting element 115 is reflected on the rotor-side half-mirror 117 and then travels toward the stator-side light-receiving element 112 to be received by the same.

According to this construction, since the optical axis L of the stator-side light-emitting element 111 is directed toward the rotor-side light-receiving element 116 via the stator-side half-mirror 113, even when the rotor-side light-receiving element 116 rotates with rotation of the slit disk 83, the optical signal from the stator-side light-emitting element 111 does not miss the rotor-side light-receiving element 116. Similarly, since the optical axis L of the rotor-side light-emitting element 115 is directed toward the stator-side light-receiving element 112 via the rotor-side half-mirror 117, even when the rotor-side light-emitting element 115 rotates with rotation of the slit disk 83, the optical signal from the rotor-side light-emitting element 115 does not miss the stator-side light-receiving element 112. Therefore, regardless of whether or not the slit disk 83 is rotating, it is possible to carry out bidirectional optical communications. Further, the use of the two half-mirrors 113, 117 makes it possible to prevent interference between the stator-side light-emitting element 111 and the stator-side light-receiving element 112 as well as interference between the rotor-side light-emitting element 115 and the rotor-side light-receiving element 116. It should be noted that the stator-side and rotor-side light-emitting elements 111, 115 may be arranged on the rotation axis S, respectively, and the stator-side and rotor-side light-receiving elements 112, 116 may be arranged in horizontal orientations at respective locations away from the light-emitting elements 111, 115.

Figure 7A:
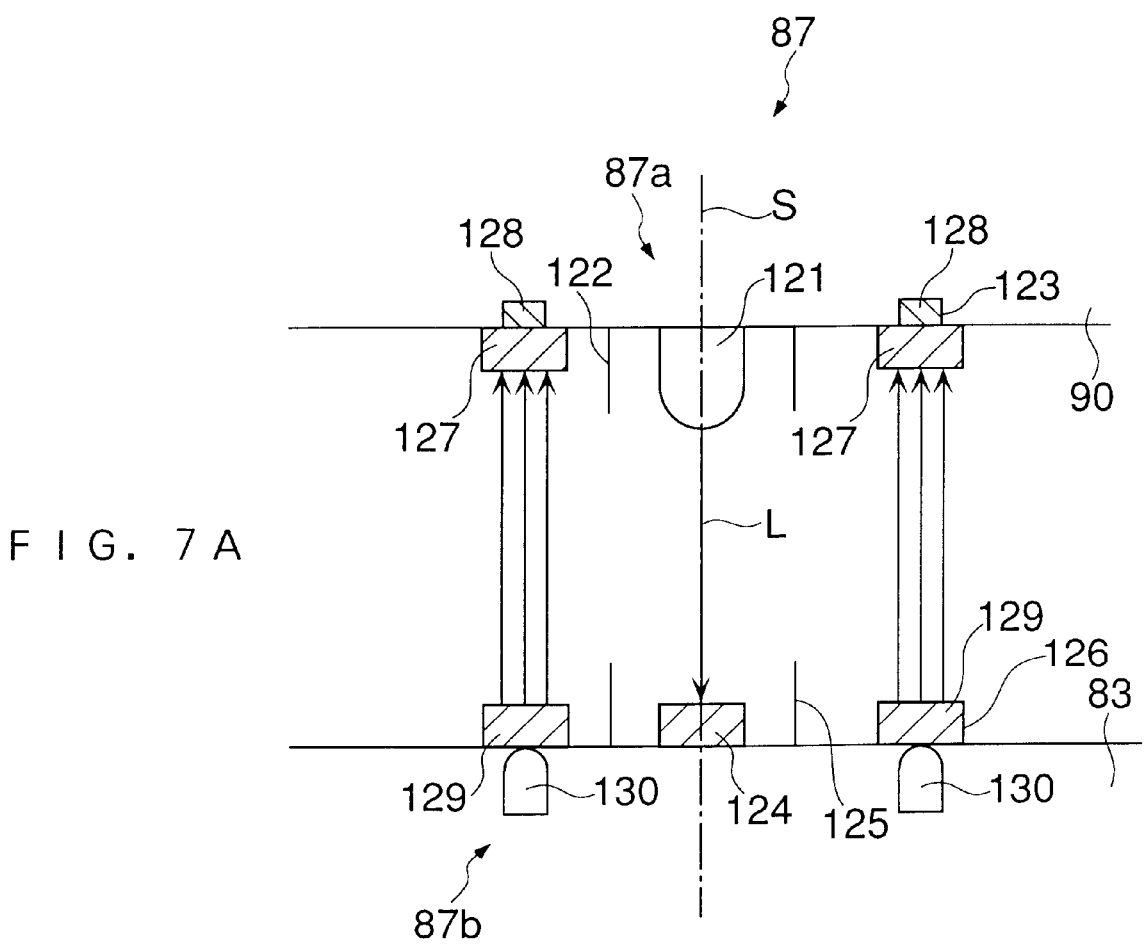
FIGS. 7A and 7B are views schematically showing the construction of an optical communication block (optical communication device) according to a third embodiment of the invention.
Figure 7B:
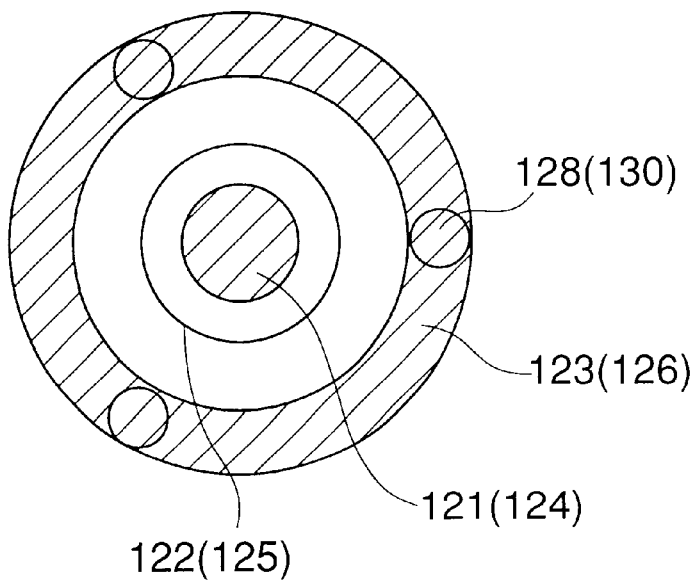

Next, description will be made of the construction of a bidirectional coupler 87 according to a third embodiment with reference to FIGS. 7A and 7B. As shown in the figures, a stator-side light-emitting element 121, a stator-side light shield 122, and a stator-side light-receiving element 123 are arranged on the underside surface of the upper circuit board (stator-side member) 90 in a manner concentric with each other. Similarly, a rotor-side light-receiving element 124, a rotor-side light shield 125, and a rotor-side light-emitting element 126 are arranged on the topside surface of the slit disk (rotary member) 83 in a manner concentric with each other. In this embodiment, an output optical coupler 87a is formed by the stator-side light-emitting element 121 and the rotor-side light-receiving element 124 opposed thereto, while an input optical coupler 87b is formed by the rotor-side light-emitting element 126 and the stator-side light-receiving element 123 opposed thereto.

The stator-side light-emitting element 121 and the rotor-side light-receiving element 124 are arranged on the rotation axis S of the slit disk 83. The stator-side light-receiving element 123 is comprised of a light-diffusing member 127 formed to have an annular shape, and three phototransistors 128 arranged on a reverse side of the light-diffusing member 127 at circumferential equal intervals along a circumference of the same. Similarly, the rotor-side light-emitting element 126 is comprised of a light-diffusing member 129 formed to have an annular shape, and three light-emitting diodes 130 arranged on a reverse side of the light-diffusing member 129 at circumferential equal intervals along a circumference of the same. The stator-side light shield 122 formed to have an annular shape is interposed between the stator-sidelight-emitting element 121 and the stator-side light-receiving element 123 in a manner projecting downward from the underside surface of the circuit board 90. Similarly, the rotor-side light shield 125 formed to have an annular shape is interposed between the rotor-side light-receiving element 124 and the rotor-side light-emitting element 126 in a manner projecting upward from the topside surface of the slit disk 83.

The stator-side light-emitting element 121 and the rotor-side light-receiving element 124 are opposed to each other on the rotation axis S, and hence an optical signal emitted from the stator-side light-emitting element 121 travels straight toward the rotor-side light-receiving element 124 to be received by the same. Similarly, the rotor-side light-emitting element 126 and the stator-side light-receiving element 123 are axially opposed to each other, and an optical signal emitted from the three light-emitting diodes 130 in a synchronous manner is diffused circularly by the light-diffusing member 129 and transmitted to the stator-side light-receiving element 123, as a circular light. The stator-side light-receiving element 123 receives the circular light by the light-diffusing member 127, and then by the three phototransistors at the same time. In the above cases, the optical signal emitted from the stator-side light-emitting element 121 is shielded by the stator-side light shield 122 so as not to be received by the stator-side light-receiving element 123, while the optical signal emitted from the rotor-side light-emitting element 126 is shielded by the rotor-side light shield 125 so as not to be received by the rotor-side light-receiving element 124.

According to this construction, since the stator-side light-emitting element 121 and the rotor-side light-receiving element 124 are opposed to each other, even when the rotor-side light-receiving element 124 rotates with rotation of the slit disk 83, the optical signal emitted from the stator-side light-emitting element 121 can reach the rotor-side light-receiving element 124 without fail. Similarly, since the rotor-side light-emitting element 126 and the annular stator-side light-receiving element 123 are opposed to each other, even when the rotor-side light-emitting element 126 rotates with rotation of the slit disk 83, the optical signal emitted from the rotor-side light-emitting element 126 can reach the stator-side light-receiving element 123 without fail. It should be noted that the positional relationship between the stator-side light-emitting element 121 and the stator-side light-receiving element 123 on the circuit board 90 and that between the rotor-side light-receiving element 124 and the rotor-side light-emitting element 126 on the slit disk 83 may be reversed, respectively.

It goes without saying that although in the above embodiments, the optical communication device (optical communication block) is applied to the control circuit of the high-speed mounter, this is not limitative, but the invention is applicable to various kinds of devices for bidirectional optical communications between the stator side and the rotor side thereof.

Further, in the above embodiments, the slip ring block 51 for supplying electrical drive power to the motors 41 of the rotary table 12, and the sensing/communication block 52 for inputting/outputting control signals and sensing states of rotation of the rotary table 12 are unitized. Therefore, compared with the prior art in which the slip ring and the rotation-sensing means are formed as separate members, it is possible to reduce the number of components and the steps of assembly process, as well as reduce the space for installation of them.

Althouugh in the embodiments, the slip ring unit is arranged on the top side of the main shaft of the rotary table, it may be arranged at the bottom side of the same, i.e. underside of the rotary table. The positional relationship as to the upper and lower positions of the slip ring block and the sensing/communication block can be set as desired.

It is further understood by those skilled in the art that the foregoing are preferred embodiments of the invention, and that various changes and modifications may be made without departing from the spirit and scope thereof.

What is claimed is:

1. An optical communication device for communicating between a circuit arranged on a side of a stator and a circuit arranged on a side of a rotor having an axis of rotation, the optical communication device comprising a pair of optical couplers arranged between said stator and said rotor, for permitting signals to be bidirectionally transmitted between said circuit arranged on said side of said stator and said circuit arranged on said side of said rotor, one of said pair of optical couplers having a rotor-side light-receiving element arranged on said rotor such that said axis of rotation extends therethrough, and a stator-side light-emitting element arranged on said stator at a location away from said axis of rotation and having an optical axis directed toward said rotor-side light-receiving element, and another of said pair of optical couplers having a stator-side light-receiving element arranged on said stator such that said axis of rotation extends therethrough, and a rotor-side light-emitting element arranged on said rotor at a location away from said axis of rotation and having an optical axis directed toward said stator-side light-receiving element.

2. An optical communication device according to claim 1, wherein said stator-side light-emitting element and said stator-sidelight-receiving element are mounted on said stator in a state molded into one piece by using an optically transparent resin, and said rotor-side light-emitting element and said rotor-side light-receiving element are mounted on said rotor in a state molded into one piece by using an optically transparent resin.

3. An optical communication device according to claim 1, wherein said stator-side light-emitting element and said rotor-side light-emitting element are each formed by a device selected from the group consisting of a light-emitting diode and a laser diode.

4. An optical communication device according to claim 1, wherein said stator-side light-receiving element and said rotor-side light-receiving element are each formed by a device selected from the group consisting of a phototransistor and a photo-diode.

5. An optical communication device for communicating between a circuit arranged on a side of a stator and a circuit arranged on a side of a rotor having an axis of rotation, the optical communication device comprising a pair of optical couplers arranged between said stator and said rotor, for permitting signals to be bidirectionally transmitted between said circuit arranged on said side of said stator and said circuit arranged on said side of said rotor, one of said pair of optical couplers having a rotor-side light-receiving element arranged on said rotor such that said axis of rotation extends therethrough, a stator-side half-mirror arranged on said stator such that said axis of rotation extends therethrough, and a stator-side light-emitting element arranged on said stator and having an optical axis extending toward said rotor-side light-receiving element via said stator-side half-mirror, and another of said pair of optical couplers having a stator-side light-receiving element arranged on said stator such that said axis of rotation extends therethrough, a rotor-side half-mirror arranged on said rotor such that said axis of rotation extends therethrough, and a rotor-side light-emitting element arranged on said rotor and having an optical axis extending toward said stator-side light-receiving element via said rotor-side half-mirror.

6. An optical communication device according to claim 5, wherein said stator-side light-emitting element and said stator-sidelight-receiving element are mounted on said stator in a state molded into one piece by a first optically transparent resin, said stator-side half-mirror being formed on a phase boundary formed in said first optically transparent resin in a manner dividing said first optically transparent resin into two parts, and said rotor-side light-emitting element and said rotor-side light-receiving element are mounted on said rotor in a state molded into one piece by a second optically transparent resin, said rotor-side half-mirror being formed on a phase boundary formed in said second optically transparent resin in a manner dividing said second optically transparent resin into two parts.

7. An optical communication device according to claim 6, wherein said rotor-side half-mirror and said stator-side half-mirror are each formed on said phase boundary by depositing a metal coating thereon.

8. An optical communication device for communicating between a circuit arranged on a side of a stator and a circuit arranged on a side of a rotor having an axis of rotation, the optical communication device comprising a pair of optical couplers arranged between said stator and said rotor, for permitting signals to be bidirectionally transmitted between said circuit arranged on said side of said stator and said circuit arranged on said side of said rotor, one of said pair of optical couplers having a light-emitting element arranged on one of said stator and said rotor such that said axis of rotation extends therethrough, and a light-receiving element arranged on an other of said stator and said rotor such that said axis of rotation extends therethrough, and another of said pair of optical couplers having an annular light-emitting element arranged on said another of said stator and said rotor in a manner concentric with respect to said axis of rotation, and an annular light-receiving element arranged on said one of said stator and said rotor in a manner concentric with respect to said axis of rotation.

9. An optical communication device according to claim 8, wherein said annular light-emitting element comprises a first annular light-diffusing member, and a light-emitting diode arranged on a reverse side of said first annular light-diffusing member, and wherein said annular light-receiving element comprises a second annular light-diffusing member, and a phototransistor arranged on a reverse side of said second annular light-diffusing member.

10. An optical communication device according to claim 9, including an annular light shield arranged between said light-emitting element and said annular light-receiving element, and an annular light shield arranged between said light-receiving element and said annular light-emitting element.

11. A slip ring unit for an electronic component-mounting apparatus including a rotary table carrying a plurality of mounting heads, a rotor-side circuit arranged in said rotary table, and a stator-side circuit arranged outside of said rotary table, the slip ring unit electrically connecting between said rotor-side circuit and said stator-side circuit, the slip ring unit comprising:

a slip ring, said slip ring having a rotary conductive member coaxially fixed on said rotary table and connected to said rotor-side circuit, and a brush member in sliding contact with said rotary conductive member and connected to said stator-side circuit;

a rotor coaxially fixed on said rotary conductive member;

an element arranged on said rotor for being sensed; and a sensor opposed to said rotor for sensing said element arranged on said rotor.

12. A slip ring unit according to claim 11, including a housing covering said rotor and said sensor.

13. A slip ring unit according to claim 12, further including an optical coupler arranged coaxially with respect to said rotor, for permitting optical communication between said rotor-side circuit and said stator-side circuit, and wherein supply of electrical drive power from said stator-side circuit to said rotor-side circuit is carried out via said brush member and said rotary conductive member, and wherein transmission of signals from said stator-side circuit to said rotor-side circuit is carried out via said optical coupler.

14. A slip ring unit according to claim 11, wherein said rotary conductive member includes a plurality of electrodes, and where in said brush member comprises a plurality of brush portions in sliding contact with said electrodes, respectively.

* * * * *